United States Patent
Maruyama et al.

(10) Patent No.: US 7,356,790 B2
(45) Date of Patent: Apr. 8, 2008

(54) DEVICE, METHOD AND PROGRAM FOR ESTIMATING THE NUMBER OF LAYERS BGA COMPONENT MOUNTING SUBSTRATE

(75) Inventors: Yoshiaki Maruyama, Tokyo (JP); Takahiro Yaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 398 days.

(21) Appl. No.: 11/169,584

(22) Filed: Jun. 30, 2005

(65) Prior Publication Data
US 2006/0005153 A1    Jan. 5, 2006

(30) Foreign Application Priority Data
Jul. 1, 2004    (JP) .............................. 2004-195579

(51) Int. Cl.
*G06F 17/50* (2006.01)
(52) U.S. Cl. ................................. 716/5; 716/11; 716/15
(58) Field of Classification Search .................... 716/5, 716/8–15
See application file for complete search history.

(56) References Cited

U.S. PATENT DOCUMENTS

2005/0278679 A1* 12/2005 Yaguchi et al. ................ 716/15
2006/0168551 A1*  7/2006 Mukuno ........................ 716/5

FOREIGN PATENT DOCUMENTS

| JP | 10-335532 A  | 12/1998 |
| JP | 11-260955 A  |  9/1999 |
| JP | 2000-090140 A |  3/2000 |
| JP | 2000-331038 A | 11/2000 |
| JP | 2000-332117 A | 11/2000 |
| JP | 2001-267430 A |  9/2001 |
| JP | 2003-318310 A | 11/2003 |

* cited by examiner

*Primary Examiner*—Paul Dinh
(74) *Attorney, Agent, or Firm*—Sughrue Mion, PLLC

(57) ABSTRACT

To estimate the number of layers required for drawing wirings out of a BGA component at a high speed. A layer number estimation device includes: a bottleneck line detection means, a wiring layer adding means, and a repeating means. The bottleneck line detection means detects a line as a bottleneck line, among a plurality of lines formed by connecting electrodes, where the number of electrodes located nearer the center side than the lines is greater comparing with the number of wirings capable of passing through the lines. The wiring layer adding means disposes electrodes, among the electrodes located nearer the center side than the bottleneck line, which remain after subtracting the number of wirings capable of passing through the bottleneck line, on the next wiring layer with vias. The repeating means causes the bottleneck line detection means and the wiring layer adding means to be executed to the next wiring layer.

8 Claims, 13 Drawing Sheets

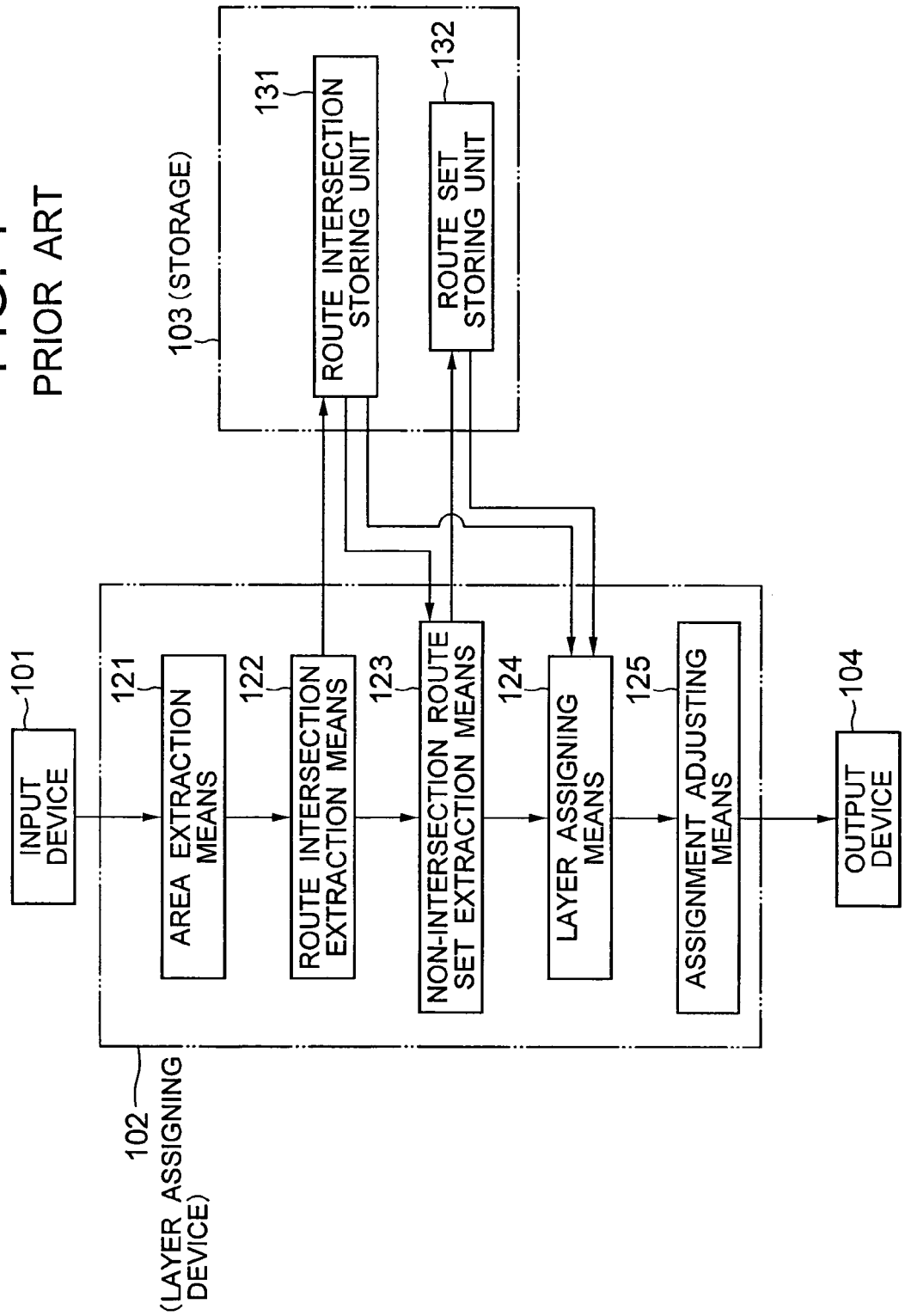

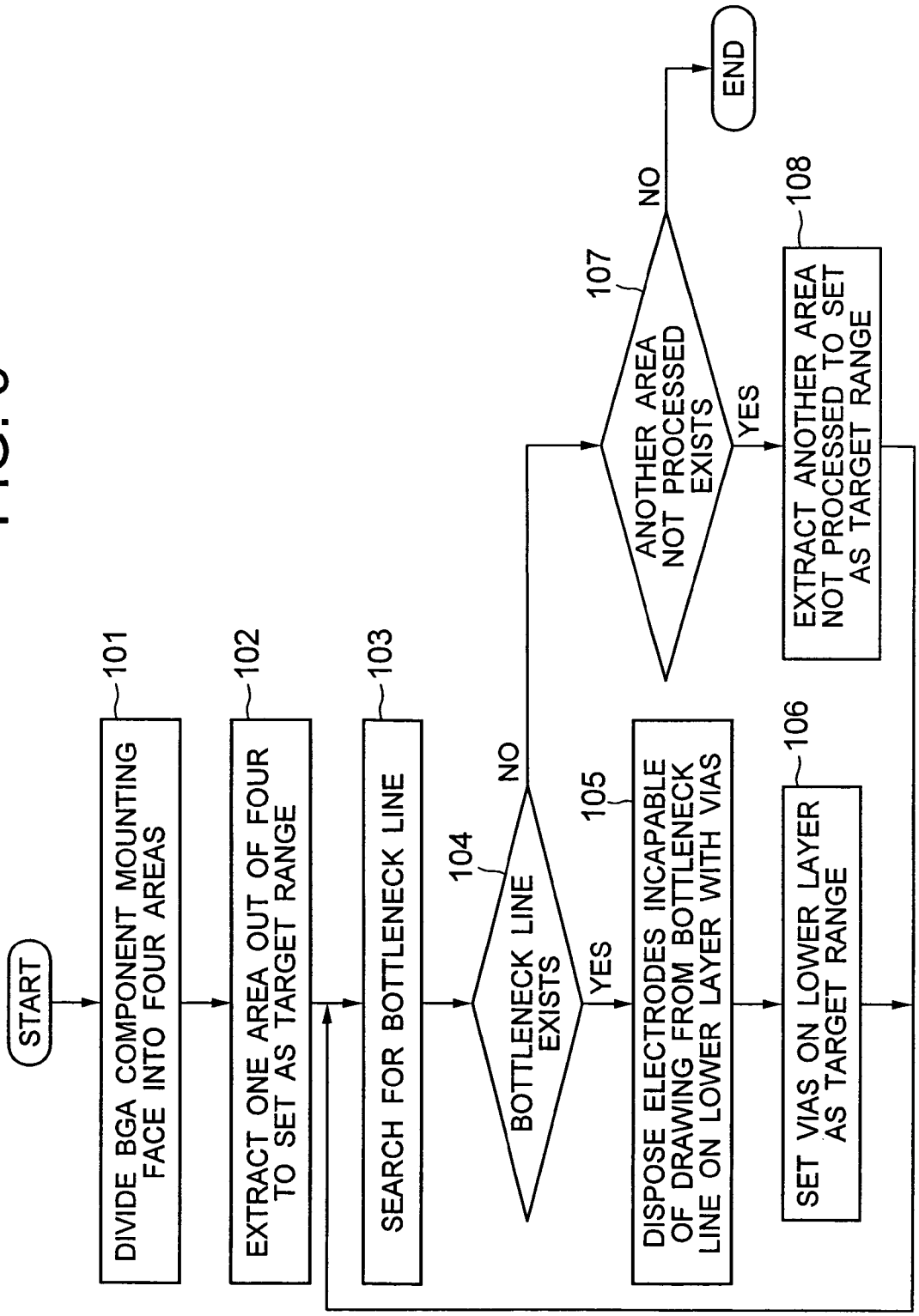

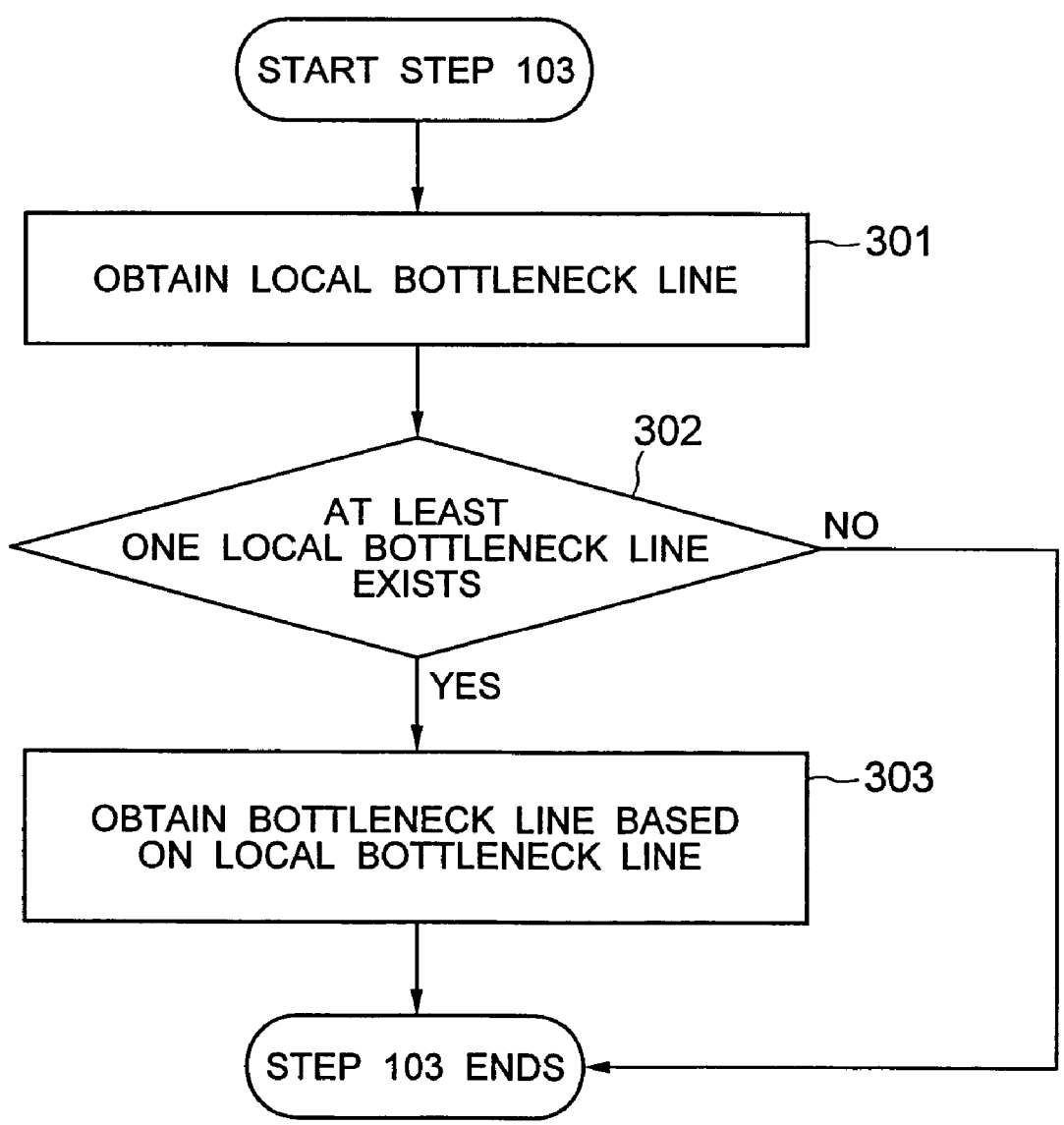

DEVICE, METHOD AND PROGRAM FOR ESTIMATING THE NUMBER OF LAYERS BGA COMPONENT MOUNTING SUBSTRATE

BACKGROUND OF THE INVENTION

1. Field of the Invention

The present invention relates to a layer number estimation device and the like, for a BGA component mounting substrate on which a BGA component is mounted, for estimating the number of wiring layers required for drawing wirings out of electrodes connected with pins of a BGA (ball grid array) component to the periphery. Note that a BGA component means a wiring board or a semiconductor chip having a BGA structure, in which a large number of pins are provided on an area from the peripheral side to the center side. A BGA component mounting substrate means a printed board or an LSI package, on which a BGA component is mounted. Further, electrodes on the BGA component side are called pins herein.

2. Related Art

Conventional art for estimating the number of vias and layers is described in, for example, Japanese Patent Application Laid-open No. 2000-331038, as a rough wiring route layer assignment system. FIG. 1 is a block diagram showing this conventional art. Hereinafter, explanation will be given based on this Figure.

A layer assigning device 102 is composed of an area extraction means 121, a route intersection extraction means 122, a non-intersecting route set extraction means 123, a layer assigning means 124, and an assignment adjusting means 125. The route intersection extraction means 122 extracts intersection information showing intersections of rough wiring routes existing in an area selected by the area extraction means 125. The non-intersection route set extraction means 123 classifies and extracts non-intersection route sets of the number less than the number of wiring layers from the rough wiring route sets within the area by referring to the intersection information, and extracts rough wiring routes, not belonging to either non-intersection route set, as elements of remaining route sets. The layer assigning means 124 performs layer assignment for detailed wirings relating to the area by referring to the intersection information, the non-intersection route sets and the remaining route sets. The assignment adjusting means 125 judges whether the layer assignment performed by the layer assigning means 124 is executable, and if judges that it is "non-executable", adjusts the layer assignment. This enables to estimate the number of vias accurately, and to minimize the number of vias required for detailed wiring, in multilayer wiring designs for an integrated circuit and a printed board.

However, the conventional art has a problem of taking time for processing, since estimation of the number of layers is carried out while searching for wiring routes.

SUMMARY OF THE INVENTION

It is therefore an object of the present invention to provide a layer number estimation device and the like for a BGA component mounting substrate, capable of estimating the number of wiring layers required for drawing wirings out of the BGA component at a high speed.

A BGA component is provided with a large number of pins on an area from the peripheral side to the center side. A layer number estimation device according to the present invention is, for a BGA component mounting substrate on which a BGA component is mounted, to estimate a number of wiring layers required for drawing wirings out of electrodes connected with the pins of the BGA component to the peripheral side. The layer number estimation device according to the present invention comprises: a bottleneck line detection means, a wiring layer adding means, and a repeating means. The bottleneck line detection means is for detecting a line, among a plurality of lines formed by connecting electrodes with each other, where the number of electrodes located nearer the center side than the lines is greater comparing with the number of wirings capable of passing through the lines, as a bottleneck line with respect to one wiring layer. The wiring layer adding means is for disposing electrodes, among the electrodes located nearer the center side than the bottleneck line detected by the bottleneck detection means, which remain after subtracting the number of wirings capable of passing through the bottleneck line, on the next wiring layer with vias as well. The repeating means is for causing processing of the bottleneck line detection means and the wiring layer adding means to be performed to the next wiring layer.

At the bottleneck line, the number of electrodes located nearer the center side than the bottleneck line is greater than the number of wirings capable of passing through the bottleneck line. That is, even trying to draw wirings out of the electrodes located nearer the center side than the bottleneck line, there are some wirings which cannot pass through the bottleneck line. Therefore, among the electrodes located nearer the center side than the bottleneck line, electrodes, which remain after subtracting the number of wirings capable of passing through the bottleneck line, are disposed on the next wiring layer with vias as well. Even for the next wiring layer, a bottleneck line is detected, and if there is a bottleneck line, electrodes are disposed again on the next wiring layer. By repeating the processing until no bottleneck line is found, the required number of wiring layers is obtained. Further, in this processing, it is possible to estimate the number of wiring layers without drawing wirings, which enables high-speed processing.

Further, a face on which the pins of the electronic component are mounted may be a square, and the bottleneck line detection means may divide the wiring layer facing the square into a plurality of areas by lines running through the center of the square, and detect the bottleneck line for each area. Here, the bottleneck line detection means may divide the square into four areas by lines connecting the center of the square and the four vertexes.

Further, the bottleneck line detection means may draw wirings out of the electrodes on the bottleneck line detected to the peripheral side, and also draw wirings out of electrodes of the number, located nearer the center side than the bottleneck line and capable of passing through the bottleneck line, to the peripheral side through the bottleneck line. In this case, by obtaining the actual state of the lead wirings on the bottleneck line, it is possible to determine the grounds of estimating the number of layers required for wirings through viewing.

More specifically, the bottleneck line detection means may include: a wiring layer dividing means for dividing a wiring layer into a plurality of areas; a line determination means for determining the lines by connecting electrodes with each other according to a predetermined rule; a passing wiring number calculation means for calculating the number of wirings capable of passing through the lines determined by the line determination means; a center side electrode number calculation means for calculating the number of electrodes located nearer the center side than the lines determined by the line determination means; and a bottleneck line determination means for determining a line as a bottleneck line if the number of electrodes calculated by the center side electrode number calculation means is greater than the number of wirings calculated by the passing wiring number calculation means.

Here, the prescribed rule may define that the sum of the number of wirings capable of passing through the lines and the number of electrodes included in the lines should be minimum. This is effective particularly when the pins on the BGA component are arrayed in a complicated manner. If the pins are arrayed simply, lines may be determined in sequence from the peripheral side, for example.

A layer number estimating method according to the present invention is so configured that the respective means of the layer number estimation device according to the present invention are replaced with steps. A layer number estimation program according to the present invention is for prompting a computer to execute the respective means of the layer number estimation device according to the present invention.

Further, the present invention can be described as follows.

First, a group of electrodes on a printed board facing the BGA component is divided into four. For each divided area, "a group of continuous line segments of electrodes in which lead wirings are arranged as close as possible" is searched by using electrode positions, the electrode configuration, the via configuration, a wiring width, a wiring gap and a via gap. If the number of electrodes located inside than the "group of continuous line segments of electrodes in which lead wirings are arranged as close as possible" is greater than the number of wirings capable of passing through the "group of continuous line segments of electrodes in which lead wirings are arranged as close as possible" in the target area, the difference is turned out to be the number of electrodes from which wirings cannot be drawn outside from the "group of continuous line segments of electrodes in which lead wirings are arranged as close as possible". In such a case, the "group of continuous line segments of electrodes in which lead wirings are arranged as close as possible" is called a bottleneck line. Since the bottleneck line exists, it is determined that a wiring layer must be added for drawing lead wirings out of the remaining electrodes. Therefore, the electrodes from which lead wirings cannot be drawn outside are disposed on the lower layer with vias, and the processing described above is performed to the electrodes, which are set as a new target area.

If the number of wirings capable of passing through the "group of continuous line segments of electrodes in which lead wirings are arranged as close as possible" is equal to or smaller than the number of electrodes located inside than the "group of continuous line segments of electrodes in which lead wirings are arranged as close as possible" in the target area, it is possible to complete the drawing processing with the current layer. Therefore, no additional layer is required to drawing the lead wirings. In such a case, it is found that no bottleneck line exists in this layer.

The above-described processing is performed in all four divided areas, and the largest number of required layers is defined as the number of layers required for drawing wirings from the pins of the target BGA component. In the above-described processing, it is possible to estimate the number of layers without drawing wirings, which enables high-speed processing.

EFFECT OF THE INVENTION

According to the present invention, it is possible to estimate the required number of layers for drawing from electrodes on a BGA component mounting substrate at a high speed. This is because, in drawing wirings on a BGA component mounting substrate, the required number of layers can be obtained without drawing wirings, by searching for an array of continuous electrodes restricting drawing of wirings.

BRIEF DESCRIPTION OF THE DRAWINGS

FIG. 1 is a functional block diagram showing conventional art;

FIG. 3 is a flowchart showing the operation of the layer number estimation device in FIGS. 2A and 2B;

FIG. 4 is a flowchart showing step 103 in FIG. 3 in detail;

PREFERRED EMBODIMENTS OF THE INVENTION

Figure 2A:
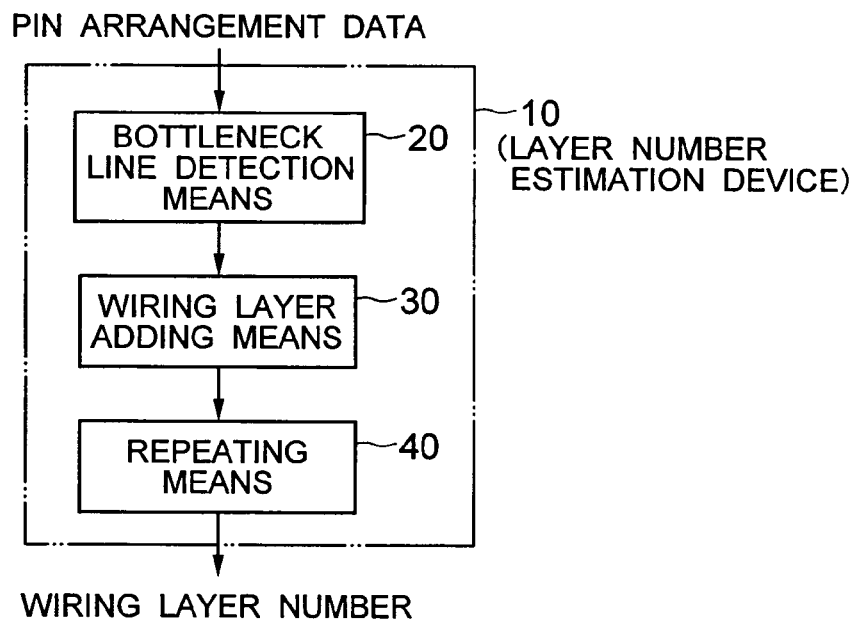
FIGS. 2A and 2B and are functional block diagrams showing a first embodiment of a layer number estimation device according to the present invention.
Figure 2B:
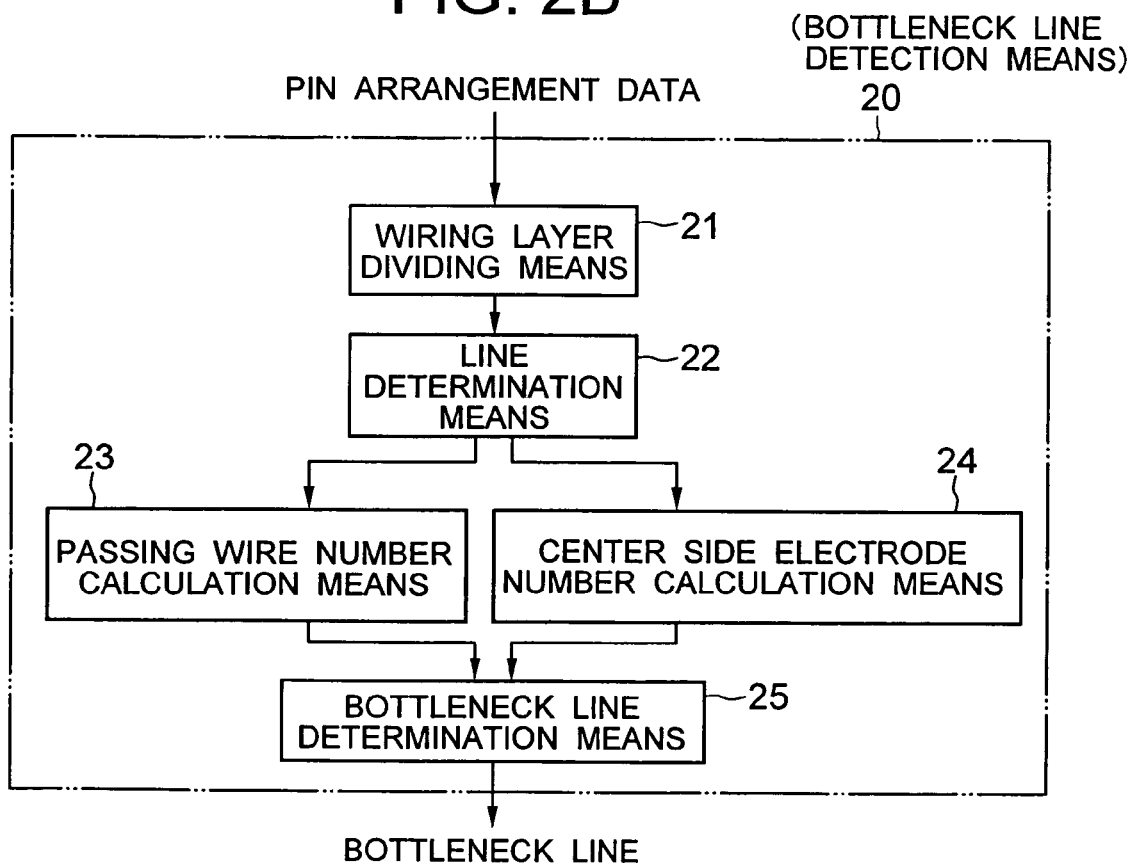

FIGS. 2A and 2B are functional block diagrams showing a first embodiment of a layer number estimation device according to the present invention. Hereinafter, explanation will be given based on these Figures.

A BGA component is provided with a large number of pins on an area from the peripheral side to the center side, although not shown. As shown in FIG. 2A, the layer number estimation device 10 of the present embodiment is to estimate the number of wiring layers required for drawing wirings out of electrodes connected with pins of the BGA component to the peripheral side, for the BGA component mounting substrate on which the BGA component is mounted, in which pin arrangement data of the BGA component is inputted and the required number of wiring layers are outputted, for example. The layer number estimation device 10 includes a bottleneck line detection means 20, a wiring layer adding means 30 and a repeating means 40. The bottleneck line detection means 20 detects lines as the bottleneck line, among a plurality of lines formed by connecting electrodes with each other, where the number of electrodes located nearer the center side than the lines is greater comparing with the number of wirings capable of passing through the lines, with respect to one wiring layer. The wiring layer adding means 30 disposes the remaining electrodes after subtracting the number of wirings capable of passing through the bottleneck line, among the electrodes located nearer the center side than the bottleneck line detected by the bottleneck line detection means 20, onto the next wiring layer with vias. The repeating means 40 causes processing of the bottleneck line detection means 20 and the wiring layer adding means 30 to be performed to the next wiring layer.

As shown in FIG. 2A, the bottleneck line detection means 20 includes: a wiring layer diving means 21 for dividing a wiring layer into a plurality of areas; a line determination means 22 for determining a line by connecting electrodes in accordance with a predetermined rule; a passing wiring number calculation means 23 for calculating the number of wirings capable of passing through the line determined by the line determination means 22; a center side electrode number calculation means 24 for calculating the number of electrodes located nearer the center side than the line determined by the line determination means 22; and a bottleneck line determination means 25 for determining the line as a bottleneck line if the number of electrodes calculated by the center side electrode number calculation means 24 is greater than the number of wirings calculated by the passing wiring number calculation means 23.

FIG. 3 is a flowchart showing the operation of the layer number estimation device of FIG. 2A. Hereinafter, explanation will be given based on FIGS. 2A, 2B and 3.

The operation of the bottleneck line detection means 20 corresponds to steps 101 to 104, the operation of the wiring layer adding means 30 corresponds to steps 104 and 105, and the operation of the repeating means corresponds to steps 106 to 108.

The operation of the layer number estimation device 10 consists of the following processing (steps 101 to 108): processing of dividing a BGA component mounting face into four areas in order to determine a drawing direction from pins of the BGA component (step 101); processing of extracting one area, which is a target range, among the four areas (step 102); processing of searching for a bottleneck line for each area (step 103), provided that a bottleneck line means a set of line segments between electrodes through which the maximum number of passing wirings are passed in between arbitrary electrodes or in between an arbitrary electrode and a dividing line; processing of determining the presence of a bottleneck line (step 104); processing of disposing the number of electrodes, corresponding to "the number incapable of drawing lead wirings out of the bottleneck line to the outside of the BGA structure", on a lower layer with vias (step 105); processing of setting a group of vias disposed on the lower layer as a new target range (step 106); processing of determining the presence of an area having not been evaluated (step 107); and processing of extracting the area having not been evaluated and setting it as a new target area (step 108).

Further, as shown in FIG. 4, the processing (step 103) includes the following processing (steps 301 to 303): processing of obtaining a local bottleneck line serving as a bottleneck line locally (step 301); processing of determining whether there is at least one local bottleneck line (step 302); and if there is at least one local bottleneck line, processing of obtaining a bottleneck line based on the local bottleneck line (step 303).

The processing can be described in detail as follows: processing of obtaining a bottleneck line; processing of obtaining a temporally bottleneck line having a possibility of being a bottleneck line, based on the local bottleneck line serving as a bottleneck line locally; and processing for recognizing the temporally bottleneck line as a bottleneck line by comparing the maximum number of wirings capable of passing through the temporally bottleneck line with the number of electrodes existing on the inner side of the BGA component than the temporally bottleneck line.

Next, the operation of the layer number estimation device of FIG. 2A will be explained in detail, by referring to the flowcharts of FIGS. 3 to 6 and the conceptual diagrams of FIGS. 7 to 11.

Figure 7:
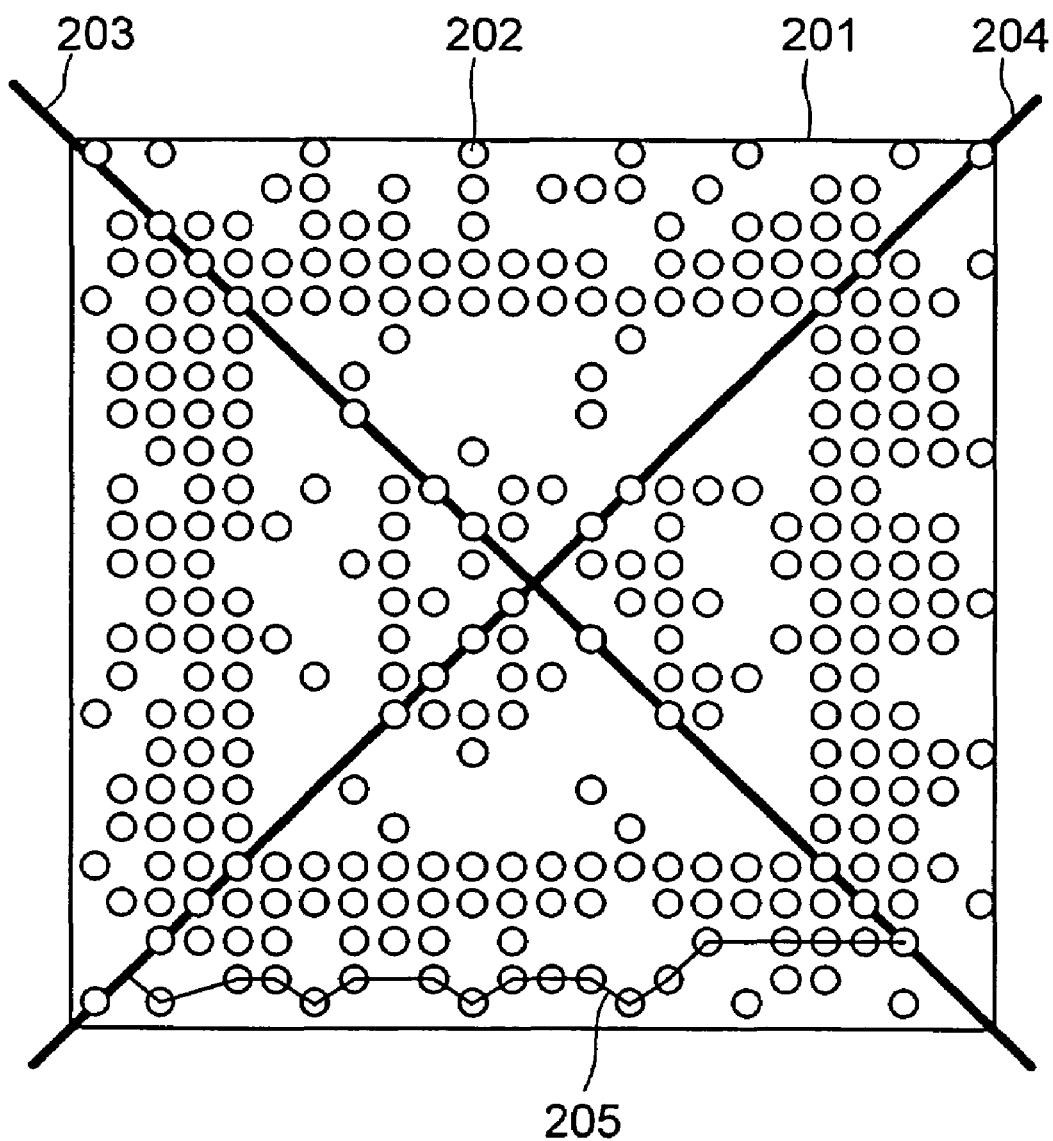
FIG. 7 is a conceptual diagram (No. 1) showing a BGA component mounting substrate for explaining the operation of the layer number estimation device of FIGS. 2A and 2B.

First, in the processing of dividing a face on which a BGA component is mounted into four areas (step 101), a group of electrodes 202 on the BGA component mounting face 201 are divided into four by a dividing line 203 and a dividing line 204, as shown in FIG. 7. The dividing line 203 and the dividing line 204 are drawn at 45 degrees to each edge of the BGA component mounting face 201 so as to pass through the center of the BGA component mounting face 201.

In the processing of extracting one area out of four areas and setting it as a target area (step 102), one area of the group of electrodes, divided in the processing (step 101), is set as a target area to be processed in the subsequent processing.

The processing of searching for a bottleneck line (step 103) is carried out according to the flow in FIG. 4. The processing of obtaining a local bottleneck line (step 301) in FIG. 4 is processing of calculating a set of lines between electrodes, which serves as a bottleneck line when comparing channels between electrodes in a local electrode area. Here, the local bottleneck line means a line serving as a bottleneck locally.

Figure 5:
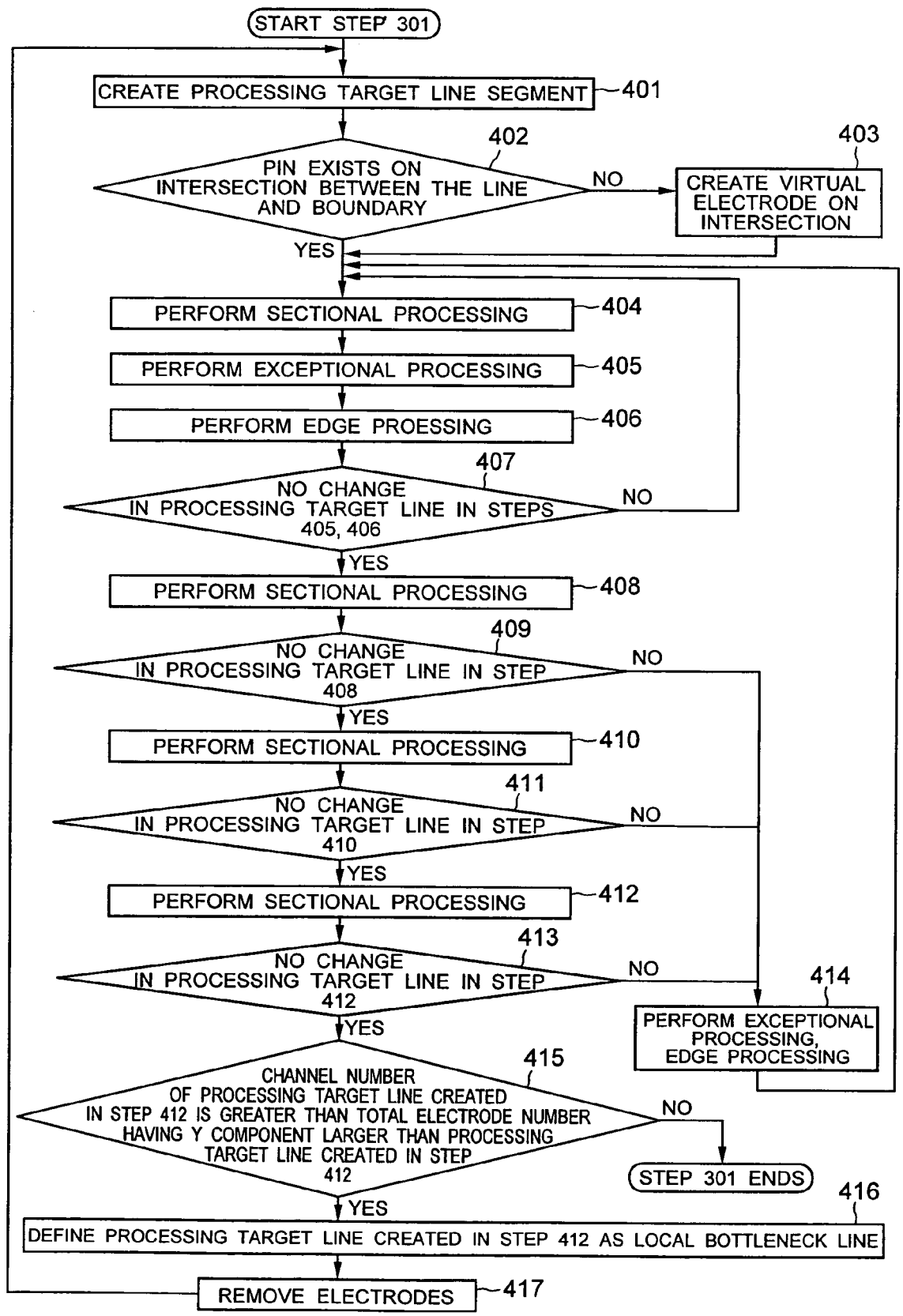
FIG. 5 is a flowchart showing step 301 in FIG. 4 in detail.
Figure 8:
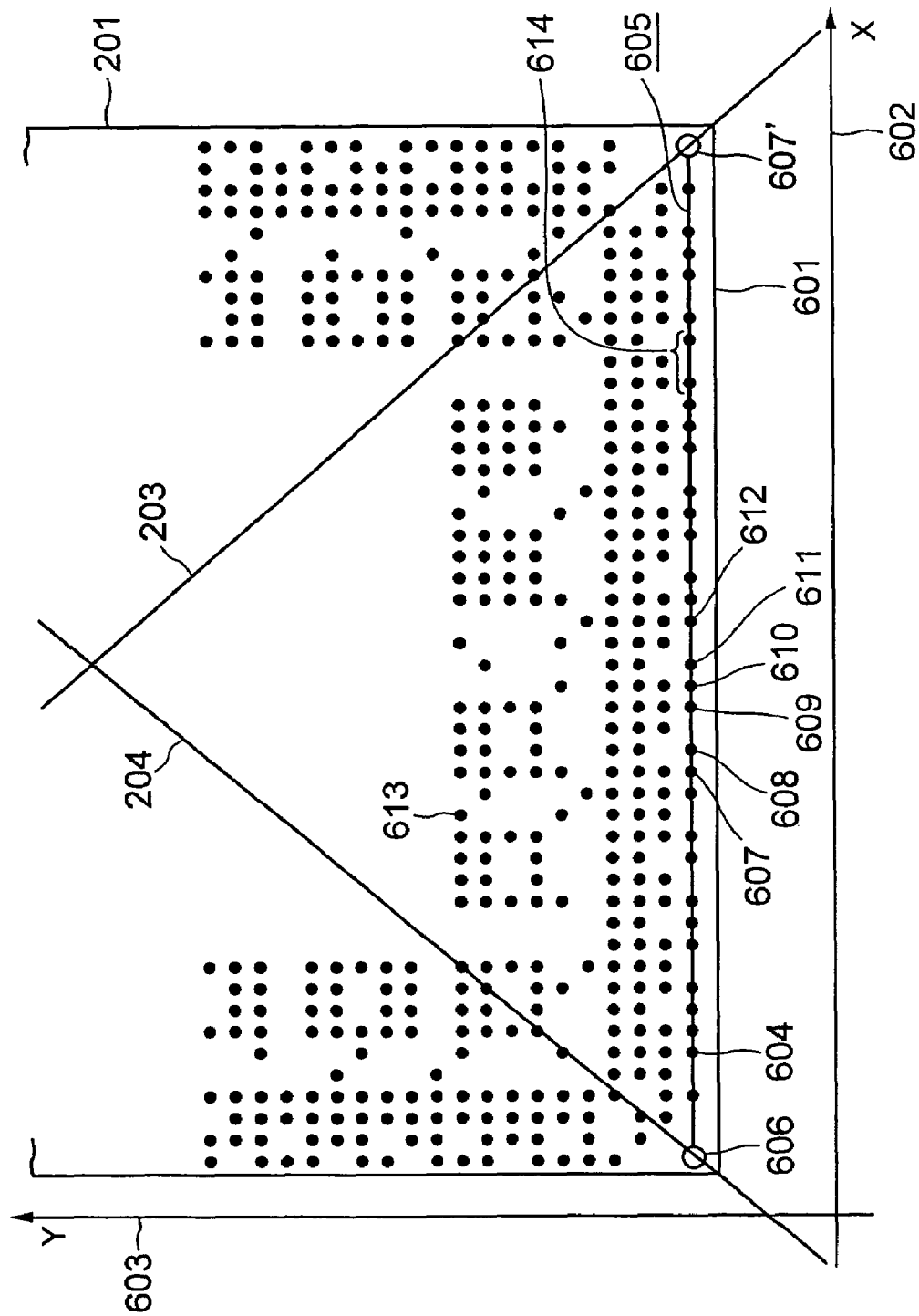
FIG. 8 is a conceptual diagram (No. 2) showing the BGA component mounting substrate for explaining the operation of the layer number estimation device of FIGS. 2A and 2B.
Figure 9E:
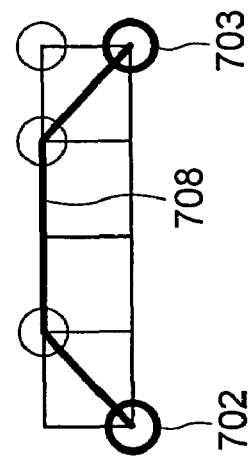
FIG. 9 is a conceptual diagram (No. 3) showing the BGA component mounting substrate for explaining the operation of the layer number estimation device of FIGS. 2A and 2B.
Figure 9F:
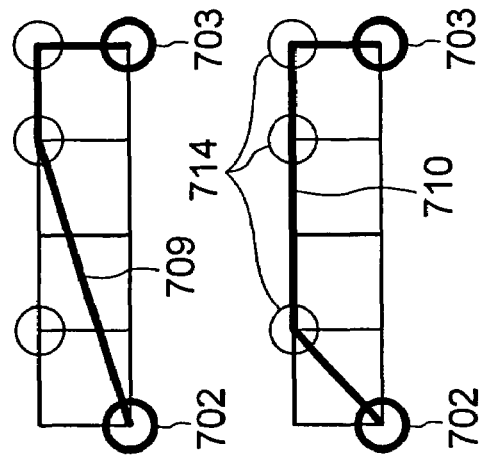
Figure 9G:
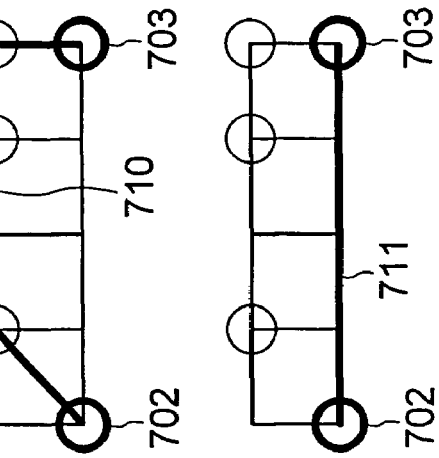
Figure 9H:
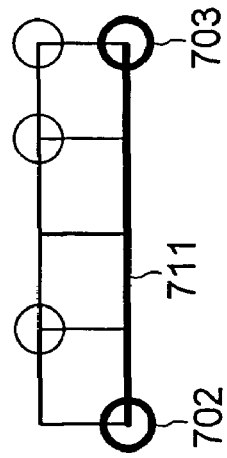
Figure 9A:
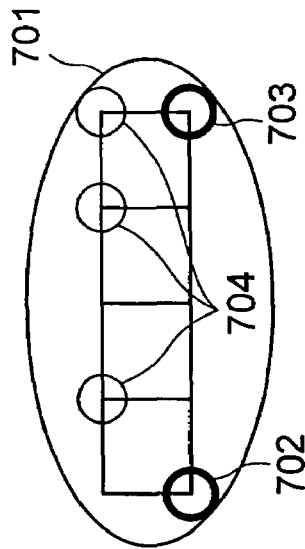
Figure 9B:
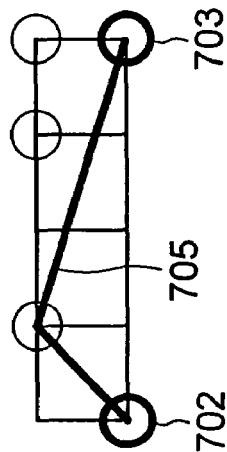
Figure 9C:
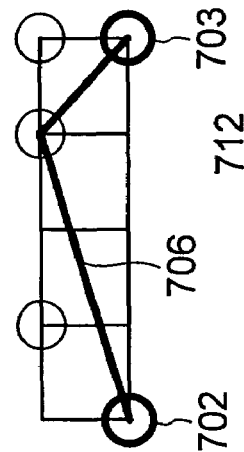
Figure 9D:
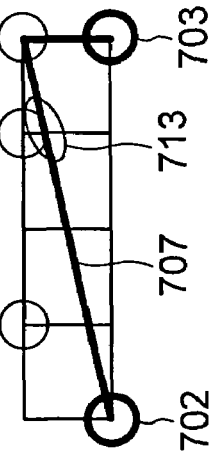
Figure 10:
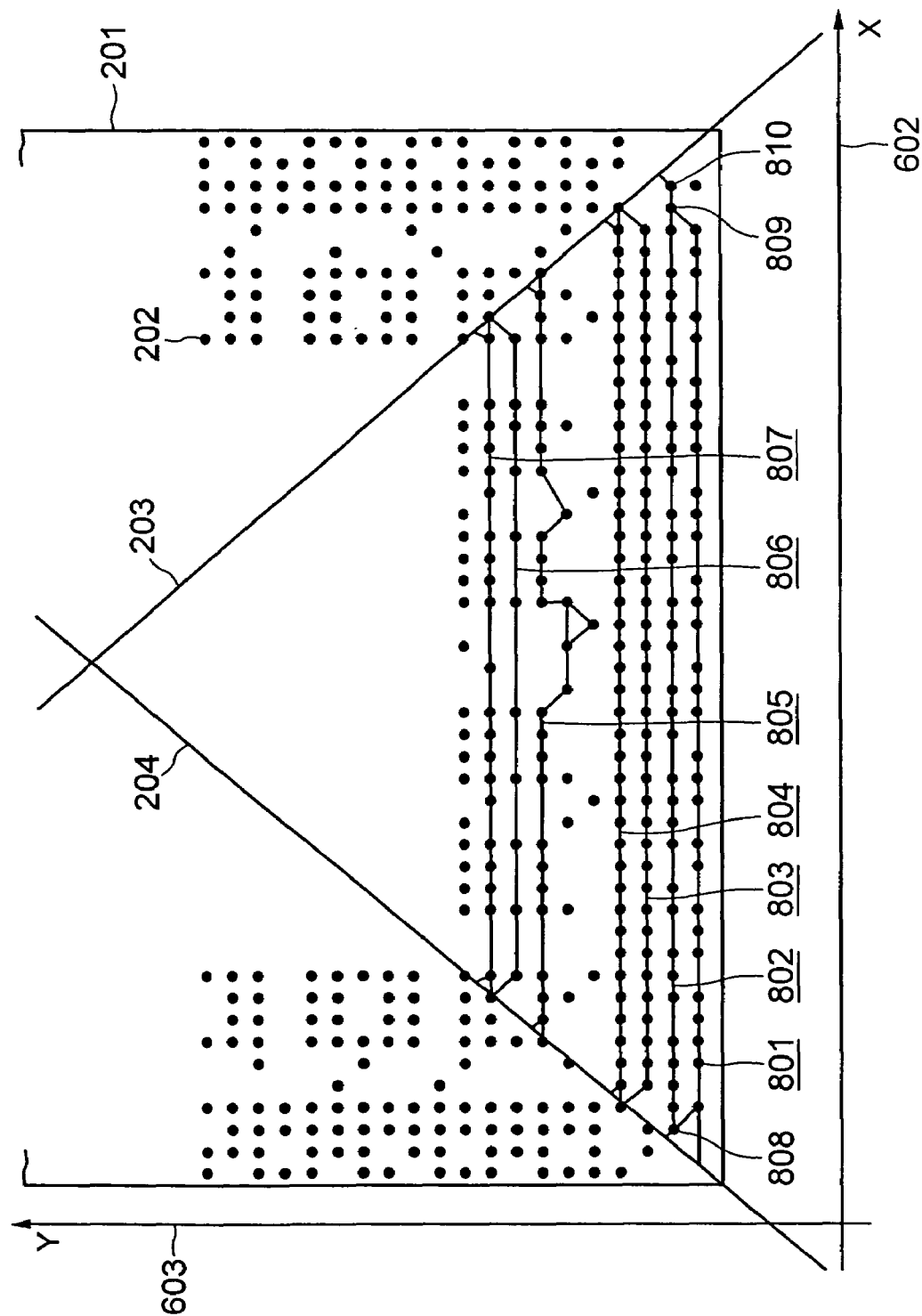
FIG. 10 is a conceptual diagram (No. 4) showing the BGA component mounting substrate for explaining the operation of the layer number estimation device of FIGS. 2A and 2B.
Figure 11:
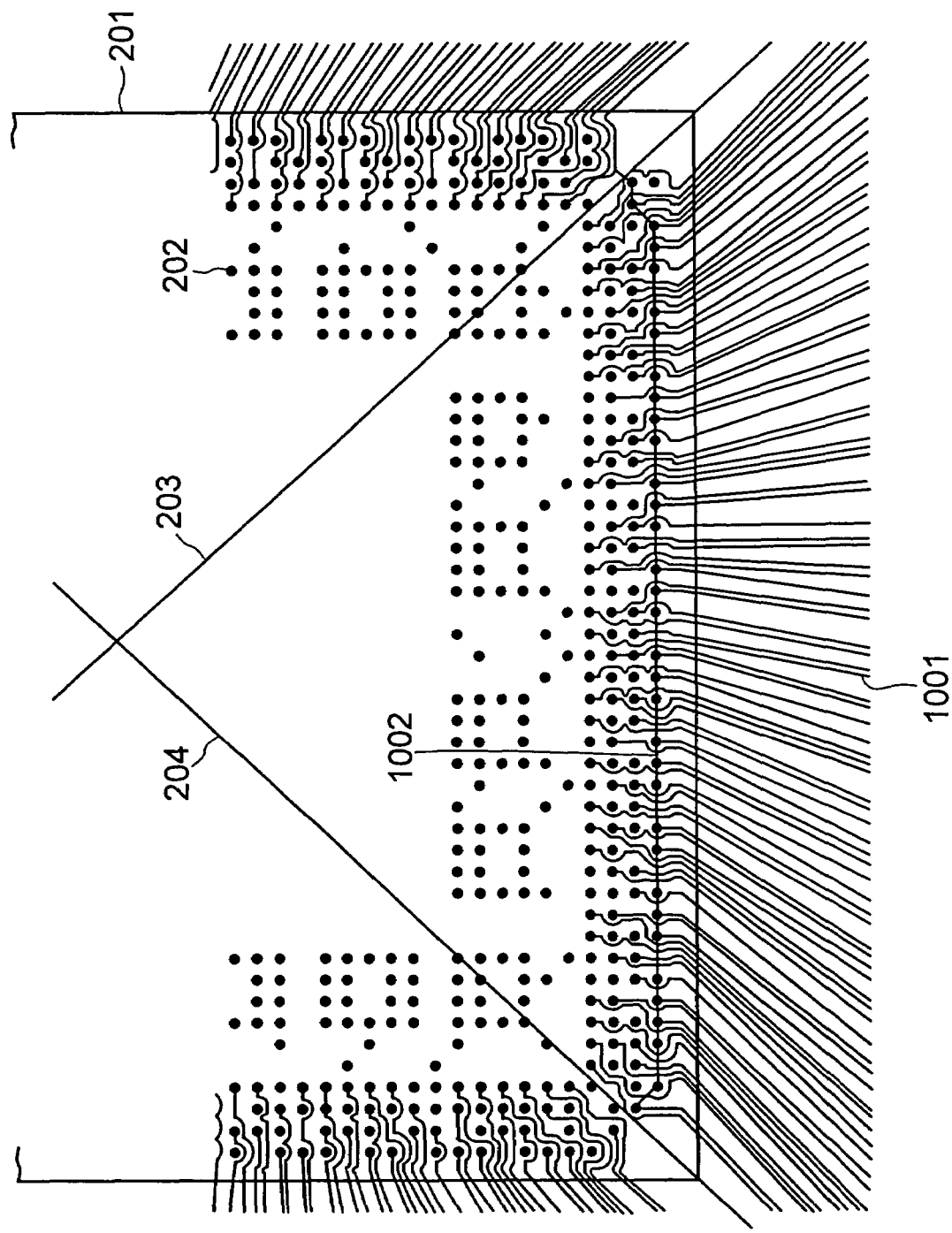
FIG. 11 is a conceptual diagram (No. 5) showing the BGA component mounting substrate for explaining the operation of the layer number estimation device of FIGS. 2A and 2B.

As a specific example, in a method of searching for a bottleneck line in one area (601 in FIG. 8) divided by the dividing lines (203, 204 in FIG. 7), first a lateral direction with respect to an array of electrodes (202 in FIG. 7) is defined as an X axis (602 in FIG. 8), and a vertical direction is defined as a Y axis (603 in FIG. 8). Then, local bottleneck lines are obtained in sequence with respect to the array area (601 in FIG. 7) of the electrodes (step 301). The processing in step 301 is shown in the flowchart of FIG. 5.

First, the smallest electrode (604 in FIG. 8) in the Y axis (603 in FIG. 8) direction is searched, and a line segment (605 in FIG. 8), delimited by the dividing lines (203, 204 in FIG. 8), of a line passing through the searched electrode (604 in FIG. 8) and in parallel with the X axis, is set as a target line in the subsequent processing (step 401). If there is no electrode (604 in FIG. 8) on the intersection points of the dividing lines (203, 204 in FIG. 8) and the target line (605 in FIG. 8), virtual electrodes (606, 607' in FIG. 8) are created on the intersection points (steps 402, 403). Here, each line segment between electrodes formed by delimiting the target line by all electrodes (604, 607 to 612, etc., in FIG. 8) between 606 and 607' in FIG. 8 is defined as 614 in FIG. 8.

Next, sectional processing is performed for each section between adjacent electrodes (between 607 and 608, between 608 and 609, between 609 and 610, between 610 and 611, between 611 and 612, etc. in FIG. 8) on the target line (605 in FIG. 8) (step 404).

The sectional processing is for finding out a line segment in which the sum of the number of wirings (hereinafter, referred to as "the number of channels") capable of crossing the line segment and the number of electrodes on the line segment (if the line segment is 710 in FIG. 9, the electrode is 714) is the minimum, among a group of line segments (705 to 711 in FIG. 9) formed by connecting through 0 or more electrodes of the group of electrodes (704 in FIG. 9) existing between the two designated electrodes (702, 703 in FIG. 9) serving as the start point and the end point. If there are a plurality of line segments in which the sums of the number of channels on the line segments (705 to 711 on FIG. 9) and the number of electrodes on the line segments in the sectional processing are the same, all of the line segments are considered as the results of the sectional processing.

However, in the sectional processing, if it is impossible to keep a sufficient interval between a line segment between electrodes (707 in FIG. 9) and an electrode (712 in FIG. 9) due to the manufacturing reason, a route including the line segment between electrodes (707 in FIG. 9) is not to be processed. Further, if a line other than the existing line segments (705 to 710 in FIG. 9) is defined as a target line (605 in FIG. 8), it is considered that the configuration is changed.

Next, exceptional processing is performed (step 405). The exceptional processing is performed to delete an overlapping line segment, if any, in line segments between electrodes (614 in FIG. 8) constituting the target line (605 in FIG. 8). Note that if an overlapping line segment is deleted, it is considered that the configuration is changed.

Next, edge processing is performed (step 406). In the edge processing, a line serving as a bottleneck locally is obtained near the dividing lines (203, 204 in FIG. 8). Note that if a line, other than existing lines, serving as a bottleneck locally is found, it is considered that the configuration is changed. If a plurality of lines serving as bottlenecks locally are found in the edge processing, all of them are treated as processing results.

Then processing of steps 404, 405 and 406 are repeated until the configuration of the line segments between electrodes (614 in FIG. 8), of the target line (605 in FIG. 8) in the exceptional processing and the edge processing, do not change any more (step 407).

When the configuration of the line segments between electrodes (614 in FIG. 8) of the target line (605 in FIG. 8) do not change any more, the sectional processing is performed in sections between electrodes where sections between electrodes are set for every other electrodes (between 607 and 609, between 609 and 611, etc. in FIG. 8) on the target line (605 in FIG. 8) (step 408). If there is a change in the configuration of line segments between electrodes (614 in FIG. 8) of the target line (605 in FIG. 8) (step 409), the exceptional processing and the edge processing are performed (step 414), and the processing is back to step 404.

If there is no change in the configuration of line segments between electrodes (614 in FIG. 8) of the target line (605 in FIG. 8), a processing section in the sectional processing is shifted for one section (shifted from processing between 607 and 609 to processing between 608 and 610, from processing between 609 and 611 to processing between 610 to 612, and the like in FIG. 8), and the sectional processing is performed (step 411) for shifted sections (between 608 and 610, between 610 and 612, etc., in FIG. 8). If there is a change in the configuration of line segments between electrodes (614 in FIG. 8) on the target line (605 in FIG. 8) (step 411), the exceptional processing and the edge processing are performed (step 414), and the processing is back to the step 404.

If there is no change in the configuration of the line segments between electros (614 of FIG. 8) of the target line (605 in FIG. 8), processing is performed for sections between electrodes of all combinations on the target line (605 in FIG. 8) (step 412). If there is a change in the configuration of line segments between electrodes (614 in FIG. 8) on the target line (605 in FIG. 8), the exceptional processing and the edge processing are performed (step 414), and the processing is back to step 404.

When there is no change in the configuration of the line segments between electrodes (614 in FIG. 8) on the target line (605 in FIG. 8), if "the number of channels of the target line (605 processed in FIG. 8) processed in step 421" is greater than "the total number of electrodes (613 in FIG. 8) having Y components in a positive direction of the Y axis with respect to the target line (605 in FIG. 8) processed in step 412", the target line (605 in FIG. 8) processed in step 412 is defined as a local bottleneck line (steps 415, 416).

Next, electrodes having Y components in a negative direction of the Y axis with respect to the local bottleneck line (613, assuming 605 in FIG. 8 is a local bottleneck line) are removed. Then, electrodes of "the number in which the number of electrodes on the local bottleneck line and the number of channels of the local bottleneck line are added" are secured from a negative direction of the Y axis, and all electrodes not secured (613 in FIG. 8) are removed. Finally, all electrodes having the minimum Y components in a positive direction of the Y axis (electrodes in a predetermined range (613 in FIG. 8), assuming 605 in FIG. 8 is the local bottleneck line) are removed. This processing of removing electrodes described above is set as step 417.

Note that removing of electrodes (613 in FIG. 8) in step 417 is performed temporarily, and the removing period is until the time that a search for all local bottleneck lines is completed. After step 414, the processing is back to step 401 to search for the next local bottleneck line.

On the other hand, if "the number of channels of the target line (605 in FIG. 8) processed in step 412" is smaller than "the total number of electrodes (613 in FIG. 8) having Y components larger than the target line processed in step 412", the processing of step 301 ends.

If no local bottleneck line is detected in step 301 (step 302), it is concluded that there is no bottleneck line, and the processing of step 103 ends. Further, if at least one local bottleneck line is detected in step 301, step 303 is performed.

Figure 6:
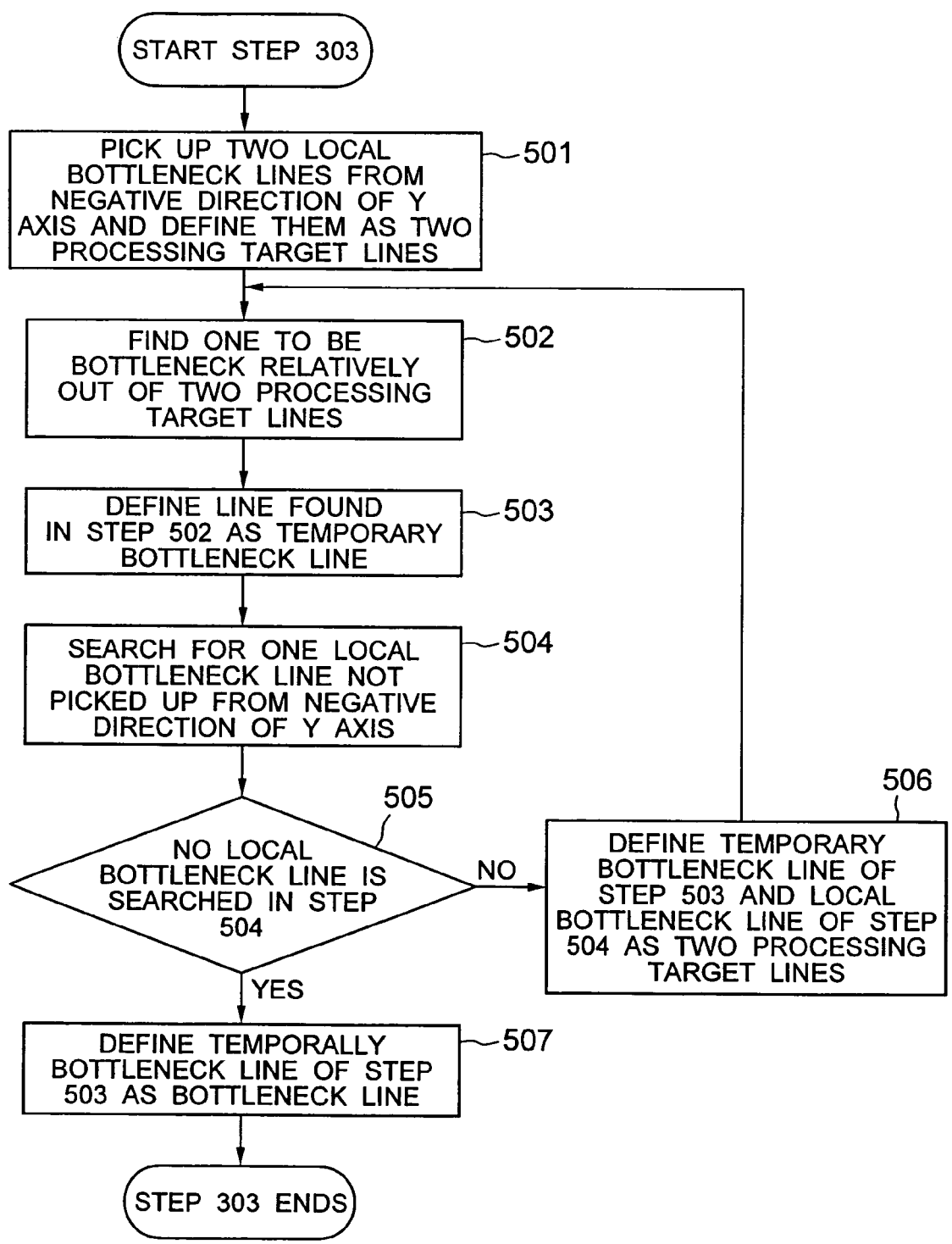
FIG. 6 is a flowchart showing step 303 in FIG. 4 in detail.

Next, processing of obtaining a bottleneck line based on local bottleneck lines (step 303) will be explained by using the flowchart of FIG. 6.

First, two bottleneck lines (801, 802 in FIG. 10) are picked up from a negative direction of the Y axis (603 in FIG. 10), which are set as two target lines for the subsequent processing (step 501). Next, if there are shared electrodes (808, 809, 810 in FIG. 9) on the two target lines (801, 802 in FIG. 10), a line which may become a bottleneck, relatively, of the two target lines is searched between each adjacent shared electrodes (808, 809, 810 in FIG. 10) in between the shared electrodes (808, 809, 810 in FIG. 10), respectively. If there is no shared electrode on the two target lines, a line which may become a bottleneck, relatively, of the two target lines is searched. The processing of finding a line which may become a bottleneck relatively, as described above, is defined as step 502. In step 502, if the two lines are equally evaluated, the both lines are considered as the processing results.

Next, a line found in step 502 is defined as a temporary bottleneck line (step 503). Then, one line (803 in FIG. 10), among local bottleneck lines (803 to 807 in FIG. 10) which have not been picked up, is searched from a negative direction of the Y axis (603 in FIG. 9) (step 504).

When a local bottleneck line is searched in step 504 (step 505), the processing is back to steps 502, while setting the temporary bottleneck line generated in step 503 and the local bottleneck line searched in step 504 as two target lines for the subsequent processing (step 506). On the other hand, if a local bottleneck line is not searched in step 504 (step 505), the temporary bottleneck line generated in step 503 is defined as a bottleneck line (step 507), and the processing of step 303 ends.

Now, step 103 is completed.

Next, in the processing of determining whether a bottleneck line exists (step 104) in FIG. 3, it is determined whether a bottleneck line has existed in step 103. If a bottleneck line (205 in FIG. 7) has existed in step 104, in processing of disposing electrodes, from which wirings cannot be drawn out of the bottleneck line, on a lower layer with vias (step 105), electrodes located inside than the bottleneck line (205 in FIG. 6) in the target area are reduced by the number of wirings capable of passing through the electrodes on the bottleneck line (205 in FIG. 6). Then, on positions of the remaining electrodes within the target area and inside the bottleneck line, vias are provided between the current layer and the lower layer.

In the processing (step 106) in FIG. 3 in which the vias on the lower layer are set as a target range, the vias provided on the lower layer in step 105 are defined as new electrodes, and the lower layer and the new electrodes are set as a new processing range. In this way, processing is repeated with respect to one area until it is determined that a bottleneck line does not exist in step 104, resulting in that the number of layers in which vias are provided is the required number of layers for drawing wirings out of pins of the BGA component in this area.

In the processing of determining whether there is any other area having not been processed (step 107) in FIG. 3, it is determined whether there is any area where steps 103 to 106 have not been performed within the areas divided in step 101.

In the processing of extracting an area having not been processed and setting it as a target range (step 108) in FIG. 3, if there is an area having not been processed in step 107, the area is set as a target range.

In this way, the required number of layers for drawing wirings out of the pins of the BGA component is obtained for all areas, and consequently, the largest number of layers in each area is defined as the required number of layers for drawing wirings out of the pins of the BGA component. Note that in FIG. 11, the reference numeral 1001 indicates a wiring drawn out, and the reference numeral 1002 indicates a bottleneck line.

Figure 12:
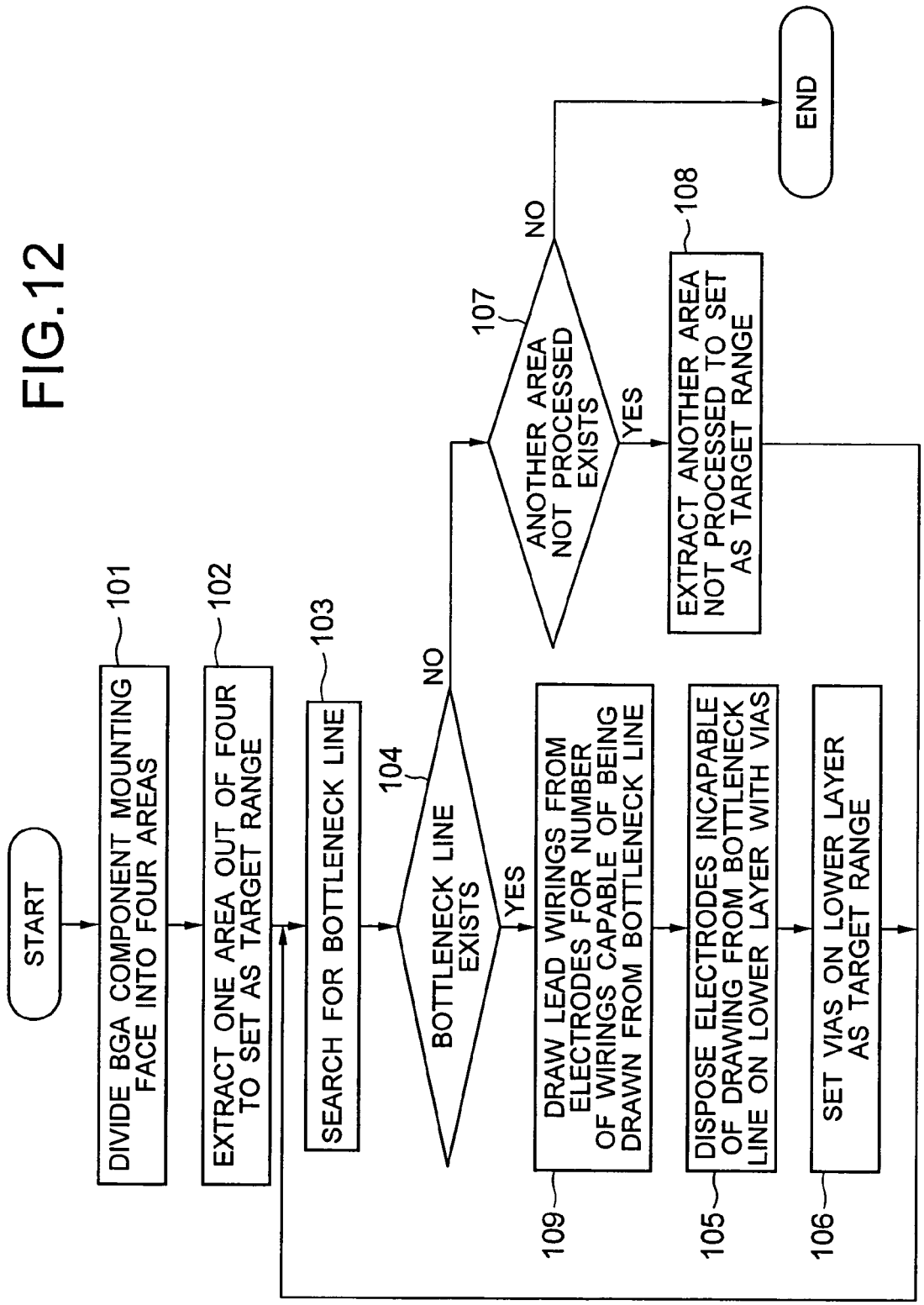
FIG. 12 is a flowchart showing the operation of a second embodiment of the layer number estimation device according to the present invention.
Figure 13:
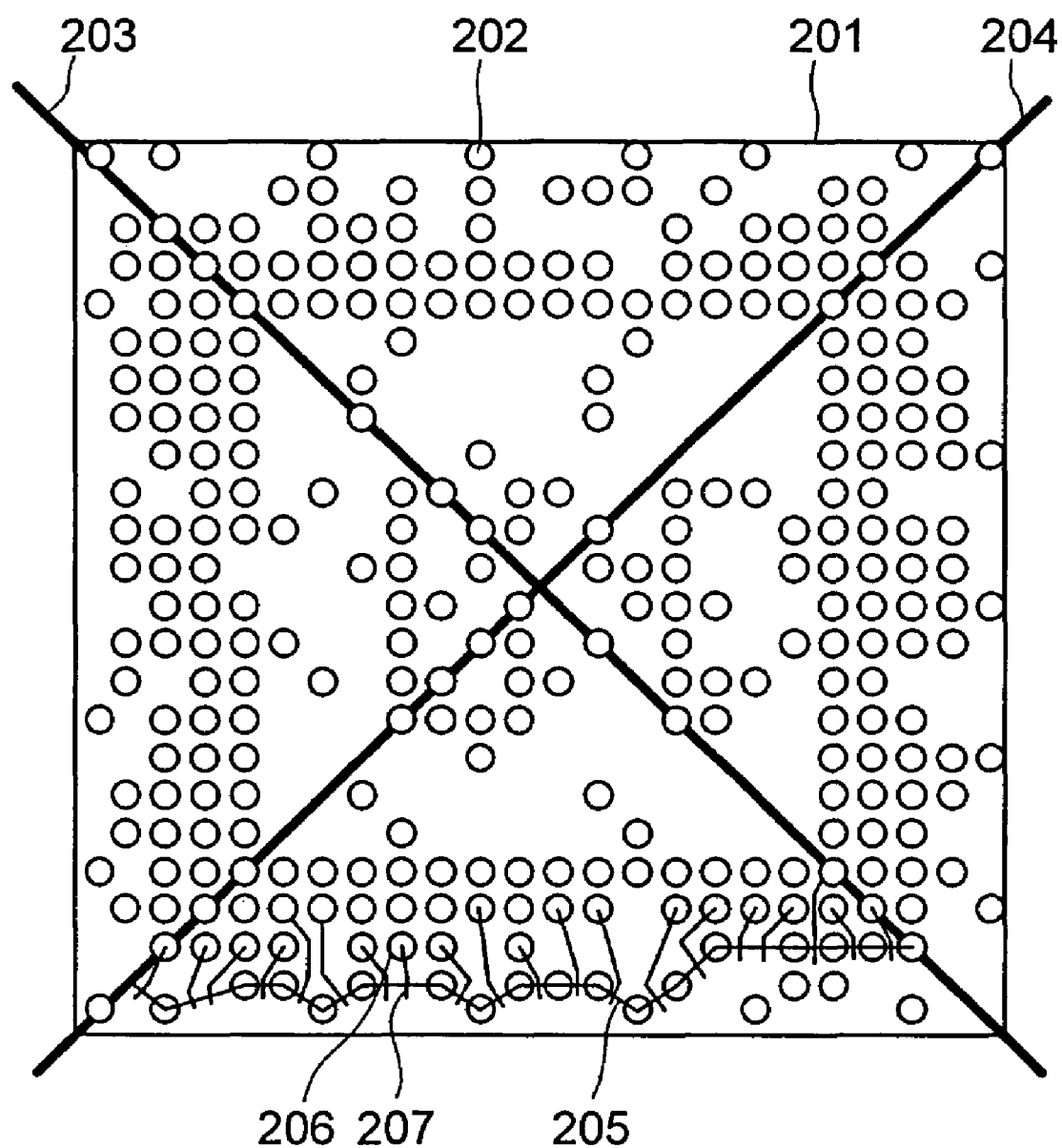
FIG. 13 is a conceptual diagram showing a BGA component mounting substrate for explaining the operation of the layer number estimation device of FIG. 12.

FIG. 12 is a flowchart showing the operation of a second embodiment of the layer number estimation device according to the present invention. FIG. 13 is a conceptual diagram showing a BGA component mounting substrate for explaining the operation of the layer number estimation device of FIG. 12. Hereinafter, explanation will be given based on these Figures.

Although not shown, the bottleneck line detection means in the present embodiment further includes a wiring drawing means. The wiring drawing means draws wirings out of electrodes on the bottleneck line detected to the peripheral side, and also draws wirings from the number of electrodes located nearer the center side than the bottleneck line and capable of passing through the bottleneck line, to the peripheral side through the bottleneck line. The wiring drawing means is located at the after stage of the bottleneck determination means 25 in FIG. 2B, for example. Hereinafter, the operation of the present embodiment will be explained in detail based on FIGS. 12 and 13.

In FIG. 12, the following processing is the same as that in the first embodiment: processing of dividing the BGA component into four areas (step 101), processing of extracting one area among the four areas and setting it as a target range (step 102), processing of searching a bottleneck line (step 103), and processing of determining whether a bottleneck line exists (step 104).

If a bottleneck line (205 in FIG. 13) has existed in step 104, processing of drawing wirings out of electrodes for the number of wirings (the number of channels) which can be drawn out of the bottleneck line is performed (step 109). In this processing, wirings 207 are drawn from electrodes 206, located inside the bottleneck line 205 within the target area and near the bottleneck line 205, of the number of wirings capable of passing between electrodes on the bottleneck line 205 in FIG. 13 so as to pass through the bottleneck line 205.

Further, the following processing is the same as that of the first embodiment as described above: processing of disposing electrodes, from which wirings cannot be drawn out of the bottleneck line in FIG. 12, on a lower layer with vias (step 105), processing of setting the vias on the lower layer as a target area (step 106), processing of determining whether there is any other area having not been processed (step 107), and processing of extracting an area having not been processed and setting it as a target area (step 108).

In this way, by obtaining the required number of layers for drawing wirings out of the pins of the BGA component and the actual state of the lead wirings 207 on the bottleneck line, it is possible to determine the grounds of estimating the number of layers required for wirings by a man through viewing.

What is claimed is:

1. A layer number estimation device, for an electronic component mounting substrate on which an electronic component provided with a plurality of pins on an area from a peripheral side to a center side is mounted, which estimates a number of wiring layers required for drawing wirings out of electrodes connected with the pins to the peripheral side, the device comprising:

bottleneck detection means for detecting a line, among a plurality of lines formed by connecting the electrodes with each other, where a number of electrodes located nearer the center side than the lines is greater comparing with a number of wirings capable of passing through the lines, as a bottleneck line with respect to one wiring layer;

wiring layer adding means for disposing electrodes, among the electrodes located nearer the center side than the bottleneck line detected by the bottleneck detection means, which remain after subtracting the number of wirings capable of passing through the bottleneck line, on a next wiring layer as well; and repeating means for causing processing of the bottleneck line detection means and the wiring layer adding means to be performed to the next wiring layer.

2. The layer number estimation device, as claimed in claim 1, wherein a face on which the pins of the electronic component are mounted is a square, and the bottleneck line detection means divides the wiring layer facing the square into a plurality of areas by a line running through a center of the square, and detects the bottleneck line for each area.

3. The layer number estimation device, as claimed in claim 1, wherein the bottleneck line detection means divides the square into four areas by lines connecting the center of the square and four vertexes.

4. The layer number estimation device, as claimed in claim 1, wherein
the bottleneck line detection means draws wirings out of the electrodes on the bottleneck line detected to the peripheral side, and also draws wirings out of electrodes located nearer the center side than the bottleneck line to the peripheral side while avoiding the electrodes on the bottleneck line and crossing the bottleneck line.

5. The layer number estimation device, as claimed in claim 2, wherein the bottleneck line detection means comprises:
wiring layer dividing means for dividing the wiring layer into a plurality of areas;
line determination means for determining the lines by connecting electrodes with each other according to a predetermined rule;
passing wiring number calculation means for calculating the number of wirings capable of passing through the lines determined by the line determination means;
center side electrode number calculation means for calculating the number of electrodes located nearer the center side than the lines determined by the line determination means; and
bottleneck line determination means for determining a line as a bottleneck line if the number of electrodes calculated by the center side electrode number calculation means is greater than the number of wirings calculated by the passing wiring number calculation means.

6. The layer number estimation device, as claimed in claim 5, wherein the prescribed rule is that a sum of the number of wirings capable of passing through the lines and the number of electrodes included in the lines should be minimum.

7. A layer number estimating method, for an electronic component mounting substrate on which an electronic component provided with a plurality of pins on an area from a peripheral side to a center side is mounted, for estimating a number of wiring layers required for drawing wirings out of electrodes connected with the pins to the peripheral side, the method comprising:

a bottleneck line detecting step in which a line, among a plurality of lines formed by connecting the electrodes with each other, where a number of electrodes located nearer the center side than the lines is greater comparing with a number of the wirings capable of passing through the lines, is detected as a bottleneck line with respect to one wiring layer;

a wiring layer adding step in which electrodes, among the electrodes located nearer the center side then the bottleneck line detected in the bottleneck line detecting step, which remain after subtracting the number of wirings capable of passing through the bottleneck line, are disposed on a next wiring layer as well; and a repeating step in which processing of the bottleneck line detecting step and the wiring layer adding step is caused to be performed to the next wiring layer.

8. A layer number estimating program, for an electronic component mounting substrate on which an electronic component provided with a plurality of pins on an area from a peripheral side to a center side is mounted, for estimating a number of wiring layers required for drawing wirings out of electrodes connected with the pins to the peripheral side, wherein the program prompts a computer to serve as:

bottleneck line detection means for detecting a line as a bottleneck line, among a plurality of lines formed by connecting electrodes, in which a number of electrodes located nearer the center side than the lines is greater comparing with a number of wirings capable of passing through the line;

wiring layer adding means for disposing electrodes, among the electrodes located nearer the center side than the bottleneck line detected by the bottleneck line detection means, which remain after subtracting the number of wirings capable of passing through the bottleneck line, on a next wiring layer; and repeating means for causing processing of the bottleneck line detection means and the wiring layer adding means to be performed to the next wiring layer.

* * * * *